(12) United States Patent
Kim

(10) Patent No.: US 10,872,561 B2
(45) Date of Patent: Dec. 22, 2020

(54) ELECTROLUMINESCENCE DISPLAY DEVICE HAVING BUFFER LAYER

(71) Applicant: LG Display Co., Ltd., Seoul (KR)

(72) Inventor: KyungMan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 68 days.

(21) Appl. No.: 16/204,335

(22) Filed: Nov. 29, 2018

(65) Prior Publication Data

US 2019/0180682 A1    Jun. 13, 2019

(30) Foreign Application Priority Data

Dec. 8, 2017  (KR) ......................... 10-2017-0168583

(51) Int. Cl.

| H01L 29/08 | (2006.01) |
|---|---|
| G09G 3/3233 | (2016.01) |
| G09G 3/3216 | (2016.01) |
| G09G 3/3275 | (2016.01) |
| H01L 51/52 | (2006.01) |
| H01L 27/32 | (2006.01) |
| H01L 51/50 | (2006.01) |

(52) U.S. Cl.
CPC ......... *G09G 3/3233* (2013.01); *G09G 3/3216* (2013.01); *G09G 3/3275* (2013.01); *H01L 27/322* (2013.01); *H01L 27/3216* (2013.01); *H01L 27/3246* (2013.01); *H01L 27/3281* (2013.01); *H01L 51/5004* (2013.01); *H01L 51/5056* (2013.01); *H01L 51/524* (2013.01); *H01L 51/5253* (2013.01); *H01L 51/5284* (2013.01); *H01L 27/3223* (2013.01); *H01L 2251/5315* (2013.01); *H01L 2251/558* (2013.01)

(58) Field of Classification Search
CPC ......... H01L 51/52; H01L 27/32; H01L 51/50; H01L 51/524; H01L 27/322; H01L 51/5253; H01L 51/5004; H01L 51/5284; H01L 27/3246; H01L 27/3281; H01L 51/5056; H01L 27/3216; H01L 27/3223; H01L 2251/558; H01L 2251/5315; H01L 27/3244; G09G 3/3233; G09G 3/3216; G09G 3/3275

See application file for complete search history.

(56) References Cited

U.S. PATENT DOCUMENTS

| 9,035,545 B2 * | 5/2015 | Jeong ................... H01L 51/5243 313/504 |
|---|---|---|
| 9,331,297 B2 * | 5/2016 | Hashimoto ......... H01L 51/5221 |
| 2005/0275342 A1 * | 12/2005 | Yanagawa ........... H01L 51/5246 313/504 |

(Continued)

FOREIGN PATENT DOCUMENTS

KR    10-2011-0128116 A    11/2011

*Primary Examiner* — Caleb E Henry
(74) *Attorney, Agent, or Firm* — Morgan, Lewis & Bockius LLP

(57) ABSTRACT

An electroluminescence display apparatus includes a first substrate; a second substrate facing the first substrate; a light emitting layer on the first substrate between the first and second substrates; an encapsulation layer on the light emitting layer; a buffer layer on an inner surface of the second substrate facing the first substrate; and a color filter layer including a first color filter and a second color filter on the buffer layer.

16 Claims, 8 Drawing Sheets

(56) References Cited

U.S. PATENT DOCUMENTS

| | | | |
|---|---|---|---|
| 2007/0132381 A1* | 6/2007 | Hayashi | H01L 51/524 313/512 |
| 2008/0018835 A1* | 1/2008 | Li | G02F 1/1339 349/106 |
| 2008/0211399 A1* | 9/2008 | Ryuji | H01L 27/322 313/506 |
| 2009/0236976 A1* | 9/2009 | Lee | H01L 51/5284 313/504 |
| 2011/0049661 A1* | 3/2011 | Maehara | H01L 27/307 257/432 |
| 2011/0285641 A1 | 11/2011 | Huang | |
| 2012/0217516 A1* | 8/2012 | Hatano | H01L 51/525 257/88 |
| 2015/0001576 A1* | 1/2015 | Iwata | H01L 51/5246 257/100 |
| 2016/0170524 A1* | 6/2016 | Kim | G06F 3/044 345/174 |
| 2018/0095566 A1* | 4/2018 | Lee | H01L 27/3244 |
| 2018/0183006 A1* | 6/2018 | Ishida | H01L 51/5246 |

\* cited by examiner

ELECTROLUMINESCENCE DISPLAY DEVICE HAVING BUFFER LAYER

CROSS-REFERENCE TO RELATED APPLICATIONS

This application claims the benefit of the Korean Patent Application No. 10-2017-0168583 filed on Dec. 8, 2017, which is hereby incorporated by reference as if fully set forth herein.

BACKGROUND

Technical Field

The present disclosure relates to an electroluminescence display apparatus, and more particularly, to an electroluminescence display apparatus that reduces defects caused by foreign materials.

Discussion of the Related Art

An electroluminescence display apparatus has a structure in which a light emitting layer is formed between two electrodes and the light emitting layer emits light by an electric field between the two electrodes to display an image. The light emitting layer may be formed of an organic material which emits light as excitons are generated by the combination of electrons and holes and dropped from an exited state to a ground state. Otherwise, the light emitting layer may be formed of an inorganic material such as quantum dot.

Hereinafter, a related art electroluminescence display apparatus will be described with reference to the drawings. FIG. 1 is a cross-sectional view of the related art electroluminescence display apparatus.

As illustrated in FIG. 1, the related art electroluminescence display apparatus includes a first substrate 10, a circuit element layer 20, a first electrode 30, a bank 40, a light emitting layer 50, a second electrode 60, and a second substrate 70.

The circuit element layer 20 is formed on the first substrate 10. Various signal lines, thin film transistors (TFTs), capacitors, and the like, are formed on the circuit element layer 20.

The first electrode 30 is formed on the circuit element layer 20. The first electrode 30 is patterned by each pixel and serves as an anode of the electroluminescence display apparatus.

The bank 40 has a matrix structure to define emission areas. The light emitting layer 50 is formed in an emission area defined by the bank 40. The second electrode 60 is formed on the light emitting layer 50. The second electrode 60 serves as a cathode of the electroluminescence display apparatus.

The second substrate 70 is positioned above the second electrode 60 and bonded to the first substrate 10 by an adhesive layer.

In the related art electroluminescence display apparatus, a foreign material f may occur during a manufacturing process and may be present on the second electrode 60. If the second substrate 70 is bonded to the first substrate 10 with the foreign material f, an element may be damaged or defective due to the pressing force by the foreign material f.

SUMMARY

Accordingly, embodiments of the present disclosure are directed to an electroluminescence display apparatus that substantially obviates one or more of the problems due to limitations and disadvantages of the related art.

An aspect of the present disclosure is to provide an electroluminescence display apparatus in which element defects resulting from a pressing by a foreign material during a bonding process can be avoided.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, an electroluminescence display apparatus comprises a first substrate; a second substrate facing the first substrate; a light emitting layer on the first substrate between the first and second substrates; an encapsulation layer on the light emitting layer; a buffer layer on an inner surface of the second substrate facing the first substrate; and a color filter layer including a first color filter and a second color filter on the buffer layer.

In another aspect, an electroluminescence display apparatus comprises a first substrate, a second substrate facing the first substrate; a light emitting layer on the first substrate between the first and second substrates; an encapsulation layer on the light emitting layer; and a buffer layer on an inner surface of the second substrate facing the first substrate, wherein an elastic modulus of the buffer layer is smaller than an elastic modulus of the encapsulation layer.

In another aspect, an electroluminescence display apparatus comprises a first substrate, a second substrate facing the first substrate; a light emitting layer on the first substrate between the first and second substrates; an encapsulation layer on the light emitting layer; and a buffer layer on an inner surface of the second substrate facing the first substrate, wherein an elastic modulus of the buffer layer is smaller than an elastic modulus of the encapsulation layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
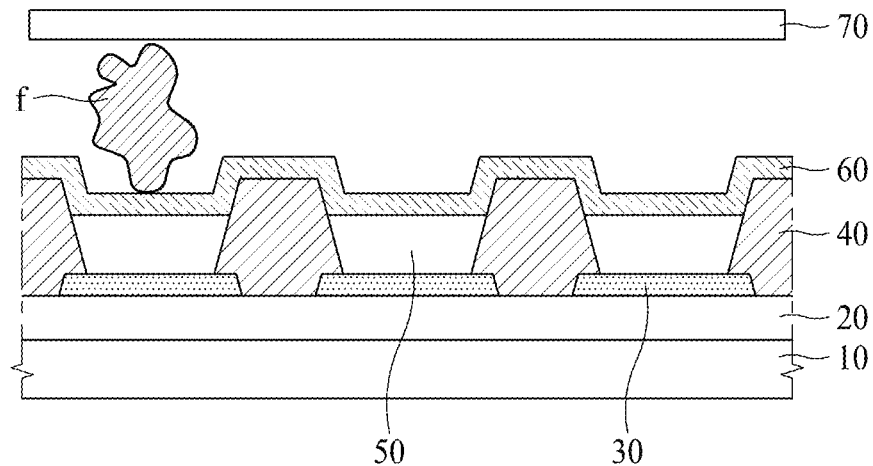
FIG. 1 is a cross-sectional view of the related art electroluminescence display apparatus.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these embodiments are provided so that this disclosure may be sufficiently thorough and complete to assist those skilled in the art to fully understand the scope of the present disclosures. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, exemplary embodiments of the present disclosure will be described in detail with reference to the accompanying drawings.

Figure 2A:
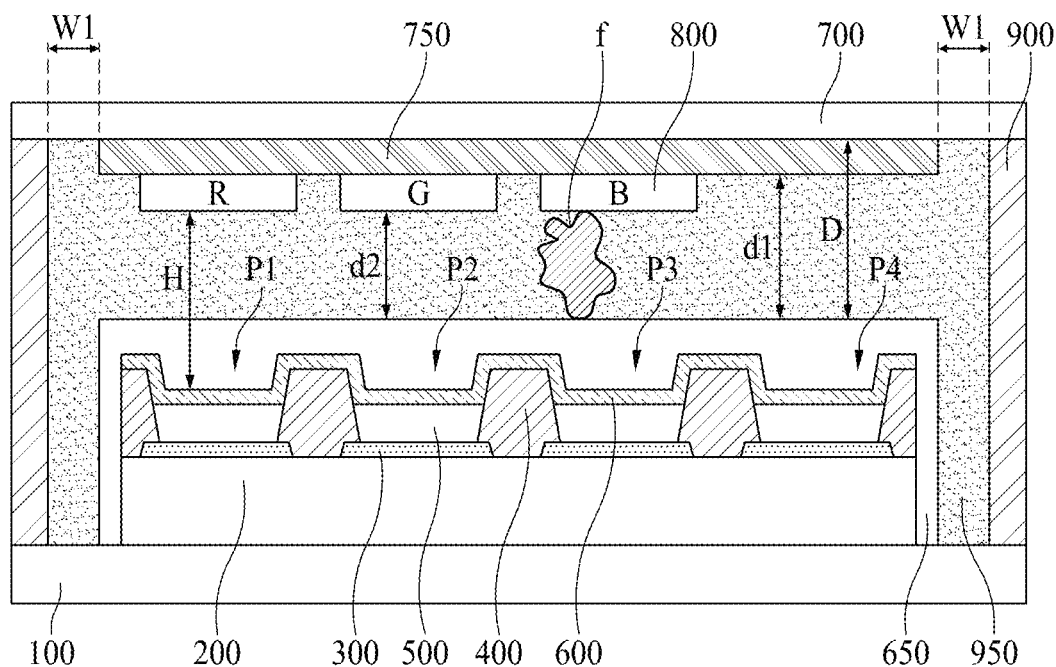
FIG. 2A is a cross-sectional view of an electroluminescence display apparatus according to an example embodiment of the present disclosure.
Figure 2B:
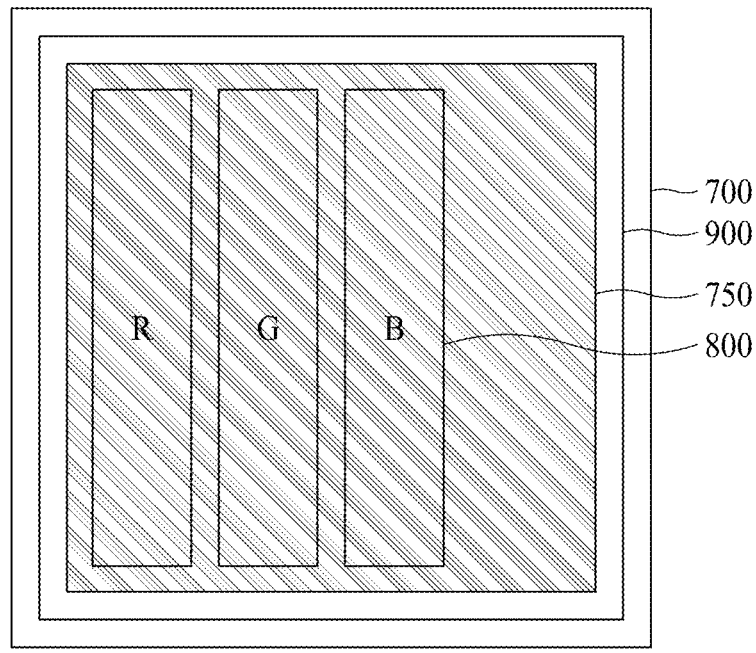
FIG. 2B is a plan view of a second substrate included in an electroluminescence display apparatus according to an example embodiment of the present disclosure.

FIG. 2A is a cross-sectional view of an electroluminescence display apparatus according to an example embodiment of the present disclosure. FIG. 2B is a plan view of a second substrate included in an electroluminescence display apparatus according to an example embodiment of the present disclosure.

As illustrated in FIG. 2A, an electroluminescence display apparatus may include a first substrate 100, a circuit element layer 200, a first electrode 300, a bank 400, a light emitting layer 500, a second electrode 600, an encapsulation layer 650, a second substrate 700, a buffer layer 750, a color filter layer 800, a dam structure 900, and a filling layer 950.

The first substrate 100 may be formed of glass or plastic but is not limited thereto. The first substrate 100 may be formed of a transparent material or an opaque material. The electroluminescence display apparatus according to an embodiment of the present disclosure may be a top emissive type in which emitted light is emitted toward the upper side, and accordingly, an opaque material, as well as a transparent material, may be used as a material of the first substrate 100.

The circuit element layer 200 is formed on the first substrate 100. On the circuit element layer 200, a circuit element including various signal lines, a thin film transistor (or, TFT), a capacitor, and the like, is provided in each of pixels P1, P2, P3, and P4. The signal lines may include gate lines, data lines, power lines, and reference lines, and the thin film transistors may include a switching TFT, a driving TFT, and a sensing TFT.

The switching TFT is switched according to a gate signal supplied to a gate line and supplies a data voltage supplied from the data line to the driving TFT. The driving TFT is switched according to a data voltage supplied from the switching TFT to generate a data current from a power source supplied from the power line and supply the generated data current to the first electrode 300. The sensing TFT, which serves to sense a threshold voltage deviation of the driving TFT which causes deterioration of image quality, supplies current of the driving TFT to the reference line in response to a sensing control signal supplied from the gate line or a separate sensing line. The capacitor, which serves to maintain a data voltage supplied to the driving TFT for one frame, is connected to each of a gate terminal and a source terminal of the driving TFT.

The first electrode 300 is formed on the circuit element layer 200. The first electrode 300 may be patterned in each of the pixels P1, P2, P3, and P4 and serve as an anode of the electroluminescence display apparatus. The first electrode 300 is connected to the driving TFT provided in the circuit element layer 200.

The electroluminescence display apparatus may be a top emission type electroluminescence display apparatus, and accordingly, the first electrode 300 may include a reflective material for upwardly reflecting light emitted from the light emitting layer 500. In this case, the first electrode 300 may have a structure in which a transparent conductive material and the reflective material are stacked.

The bank 400 is formed at the boundary between the plurality of pixels P1, P2, P3, and P4. For example, the bank 400 may be formed in a matrix structure as a whole to define an emission area in the plurality of pixels.

The bank 400 is formed on the circuit element layer 200 and covers both ends of the first electrode 300. Accordingly, a plurality of first electrodes 300 patterned at each of a plurality of pixels may be insulated by the bank 400.

The light emitting layer 500 is formed on the first electrode 300. The light emitting layer 500 is formed in the emission area of the plurality of pixels P1, P2, P3, and P4. The light emitting layer 500 may include a red light emitting layer, a green light emitting layer, and a blue light emitting layer provided in each of the plurality of pixels P1, P2, P3, and P4. The light emitting layer 500 may include a white light emitting layer provided in each of the pixels P1, P2, P3, and P4.

The light emitting layer 500 may be patterned in each of the pixels P1, P2, P3, and P4 by evaporation using a mask or patterned in each of the pixels P1, P2, P3, and P4 without a mask through a solution process using inkjet equipment, or the like. The light emitting layer 500 may be formed by evaporation without a mask, and in this case, the light emitting layer 500 may be formed even on the bank 400 as well as on the first electrode 300. The light emitting layer 500 may be formed of a white light emitting layer.

The light emitting layer 500 may include at least one of a hole injecting layer, a hole transporting layer, an organic emitting layer, an electron transporting layer, and an electron injecting layer.

The second electrode 600 is formed on the light emitting layer 500 and may serve as a cathode of an electroluminescence display apparatus.

As the second electrode 600 may be formed not only on the light emitting layer 500 but also on the bank 400, the second electrode 600 may be formed in the plurality of pixels P1, P2, P3, and P4 and the boundary regions therebetween on the whole. Therefore, the second electrode 600 may serve as a common electrode for applying a common voltage to the plurality of pixels P1, P2, P3, and P4.

The electroluminescence display apparatus may be configured as a top emission type, and accordingly, the second electrode 600 may be formed of a transparent conductive material allowing light emitted from the light emitting layer 500 to be transmitted upwards or may be formed to be thin to increase transmittance. In this case, to reduce resistance of the transparent conductive material, an auxiliary electrode having excellent electrical conductivity may be connected to the second electrode 600.

The encapsulation layer 650 is formed on the second electrode 600. The encapsulation layer 650 serves to prevent penetration of ambient moisture into the light emitting layer 500. The encapsulation layer 650 may extend from an upper surface of the second electrode 600 to a side surface of the circuit element layer 200 to block a penetration path of moisture that may enter the light emitting layer 500. The encapsulation layer 650 may be formed of an inorganic insulating material or have a structure in which an inorganic insulating material and an organic insulating material are alternately stacked, but the present disclosure is not limited thereto.

According to an example embodiment of the present disclosure, the circuit element layer 200, the first electrode 300, the bank 400, the light emitting layer 500, the second electrode 600, and the encapsulation layer 650 are provided on the first substrate 100. Here, the components provided on the first substrate 100 may be modified to various forms known in the art.

The second substrate 700 is disposed on a front surface where an image is displayed. Accordingly, the second substrate 700 is formed of a transparent material. The second substrate 700 is bonded to the first substrate 100 by the dam structure 900.

The buffer layer 750 is formed on the second substrate 700. Specifically, the buffer layer 750 is formed on an inner surface of the second substrate 700 facing the first substrate 100. The buffer layer 750 is formed of a transparent material through which light is transmitted. Here, an inner surface of a component may refer to a surface facing the inside of the electroluminescence display apparatus.

The buffer layer 750 serves to alleviate the pressing force from the foreign material f. This will be described in detail as follows.

When the first substrate 100 and the second substrate 700 are bonded to each other with the foreign material f on the encapsulation layer 650 of the first substrate 100, the elements provided on the first substrate 100 may be damaged due to the foreign material f. In particular, when the size of the foreign material f is larger than a distance D between the second substrate 700 and the encapsulation layer 650, the pressing force may severely occur due to the foreign material f to increase a possibility of damaging an element thereunder.

To reduce the possibility of damaging an element due to the foreign material f, the distance D between the second substrate 700 and the encapsulation layer 650 may be increased. Therefore, in an example embodiment of the present disclosure, the buffer layer 750 is formed on the inner surface of the second substrate 700 to increase the distance D between the encapsulation layer 650 and the second substrate 700. Thus, the possibility of damaging an element due to the foreign material f is reduced.

On the other hand, it is also possible to increase the thickness of the filling layer 950 to increase the distance D between the second substrate 700 and the encapsulation layer 650. Here, however, a distance H between the color filter layer 800 and the second electrode 600 may be increased so as to cause light leakage and a degradation of brightness based on a viewing angle.

Thus, in an example embodiment of the present disclosure, because the buffer layer 750 is formed between the second substrate 700 and the color filter layer 800, the distance D between the encapsulation layer 650 and the second substrate 700 may be increased while the distance H between the color filter layer 800 and the second electrode 600 is not increased. Accordingly, the light leakage and a degradation of brightness due to a viewing angle may be prevented and the possibility of damaging an element due to the foreign material f may be reduced.

The buffer layer 750 may be formed of a soft material to absorb pressing due to the foreign material f. To this end, an elastic modulus of the buffer layer 750 may be smaller than an elastic modulus of the encapsulation layer 650. For example, when pressing occurs due to the foreign material f, because the encapsulation layer 650 is formed of a material having a relatively high elastic modulus, it may be difficult for the encapsulation layer 650 to absorb the pressing due to the foreign material f, and thus, the pressing may affect as is to an element provided below the encapsulation layer 650. In contrast, because the buffer layer 750 is formed of a material having a relatively low elastic modulus, the buffer layer 750 may absorb the pressing due to the foreign material f, and thus, when pressing due to the foreign material f occurs, the pressing may not affect an element but be absorbed by the buffer layer 750, to prevent a defect of an element. The buffer layer 750 is formed of a transparent organic material, and thus, light emitted from the light emitting layer 500 may easily be transmitted through the buffer layer 750.

The color filter layer 800 is formed on the buffer layer 750. Specifically, the color filter layer 800 is formed on an inner surface of the buffer layer 750 facing the first substrate 100. The color filter layer 800 may include a red color filter R, a green color filter G, and a blue color filter B.

The red color filter R, the green color filter G, and the blue color filter B may be formed to be spaced apart from each other, but the present disclosure is not limited thereto. For example, the red color filter R, the green color filter G, and the blue color filter B may be formed to be contiguous or to be overlapped each other at the ends thereof in some cases.

According to an example embodiment of the present disclosure, a first pixel P1, a second pixel P2, a third pixel P3, and a fourth pixel P4 may be provided. A red color filter R may be provided in a region corresponding to the first pixel P1, a green color filter G may be provided in a region corresponding to the second pixel P2, a blue color filter B may be provided in a region corresponding to the third pixel P3, and a color filter may not be provided in a region corresponding to the fourth pixel P4. Accordingly, the portion of the buffer layer 750 provided in the region corresponding to the fourth pixel P4 is entirely in contact with the filling layer 950.

Thus, in the region corresponding to the fourth pixel P4, the foreign material f is accommodated in a space between the buffer layer 750 and the encapsulation layer 650. In the regions corresponding to the first pixel P1, the second pixel P2, and the third pixel P3, the foreign material f is accommodated in the space between the color filter layer 800 and the encapsulation layer 650.

Here, a height d1 of a space in which the foreign material f is accommodated in the region corresponding to the fourth pixel P4 is higher than a height d2 of a space accommodating the foreign material fin the region corresponding to the first pixel P1, the second pixel P2, and the third pixel P3. Thus, pressing due to the foreign material f may be relatively reduced in the region corresponding to the fourth pixel P4. However, the present disclosure may be also applied to a case in which all the pixels include only three pixels allocating the color filters R, G, and B only.

The dam structure 900 may be formed at the edges of the first substrate 100 and the second substrate 700 to bond the first substrate 100 and the second substrate 700. In addition, the dam structure 900 may prevent the filling layer 950 from flowing out to the outside. Therefore, the inside of the electroluminescence display apparatus may be sealed by the dam structure 900.

The dam structure 900 may include a moisture permeation preventing material to prevent penetration of moisture from the outside. To improve the moisture permeation preventing effect, the dam structure 900 may be in direct contact with the second substrate 700.

Specifically, when the buffer layer 750 extends between the dam structure 900 and the second substrate 700, ambient moisture may penetrate through the buffer layer 750. Thus, the buffer layer 750 might not extend between the dam structure 900 and the second substrate 700. To this end, the buffer layer 750 may be spaced apart from the dam structure 900 by a first distance W1. For example, the buffer layer 750 may not contact the dam structure 900. However, the present disclosure is not limited thereto and the buffer layer 750 may be in contact with the dam structure 900. In this case, an end of the buffer layer 750 may be in contact with the dam structure 900 so that the buffer layer 750 does not extend or is not inserted between the dam structure 900 and the second substrate 700.

The filling layer 950 fills the inside of the dam structure 900. The filling layer 950 is provided between the encapsulation layer 650 and the color filter layer 800. The filling layer 950 may be in contact with the buffer layer 750 and may be in contact with the edge regions of the first substrate 100 and the second substrate 700. The filling layer 950 may be formed of various materials known in the art.

As illustrated in FIG. 2B, the dam structure 900 is formed on the edge of the second substrate 700. The dam structure 900 has a shape corresponding to a circumference shape of the second substrate 700 and surrounds the edge of the second substrate 700.

The buffer layer 750 is formed in a plate shape on the inner side of the dam structure 900. The color filter layer 800 including the red color filter R, the green color filter G, and the blue color filter B is formed on the buffer layer 750.

Each of the red color filter R, the green color filter G, and the blue color filter B may individually form a row and may be continuous in a column direction, but the present disclosure is not limited thereto. For example, the structure illustrated in FIG. 2B is applicable to a case in which the pixels emitting the same color are arranged in the same column. However, in a case where pixels emitting different colors are arranged in the same column, the red color filter R, the green color filter G, and the blue color filter B may be patterned in each pixel that emits the respective colors.

Figure 3:
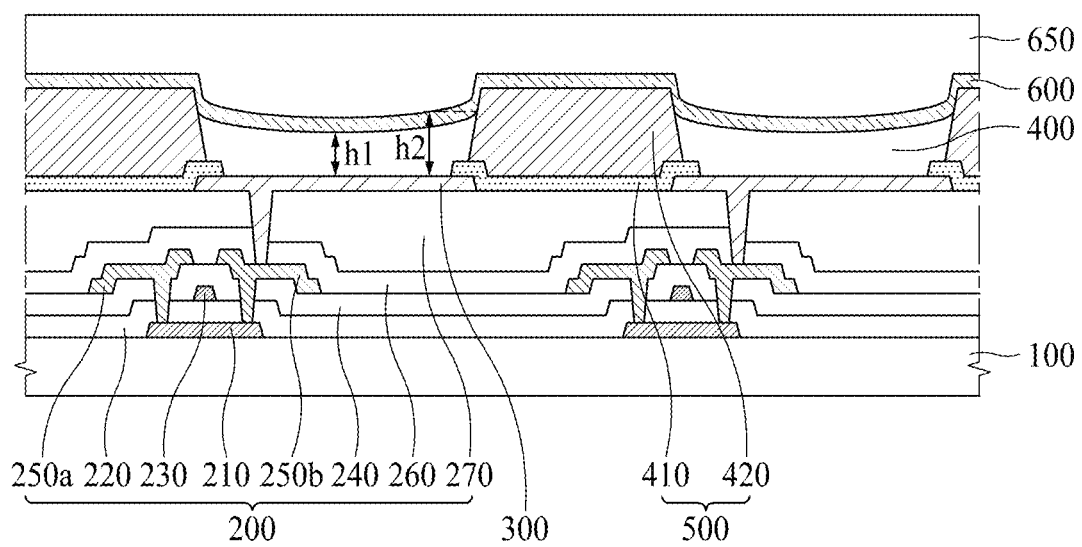
FIG. 3 is a cross-sectional view of a first substrate included in an electroluminescence display apparatus according to an example embodiment of the present disclosure.

FIG. 3 is a cross-sectional view of the first substrate constituting an electroluminescence display apparatus according to an example of the present disclosure.

As illustrated in FIG. 3, the circuit element layer 200, the first electrode 300, the bank 400, the light emitting layer 500, the second electrode 600, and the encapsulation layer 650 are formed on the first substrate 100. Hereinafter, only the components different from the above-described embodiment will be described.

The circuit element layer 200 includes an active layer 210, a gate insulating layer 220, a gate electrode 230, an interlayer insulating layer 240, a source electrode 250a, a drain electrode 250b, a passivation layer 260, and a planarization layer 270. The active layer 210 is formed on the first substrate 100. The active layer 210 may be formed of a silicon-based semiconductor material or an oxide semiconductor material but is not limited thereto. Although not shown, a light blocking layer may be additionally provided between the first substrate 100 and the active layer 210 to prevent light from entering into the active layer 210, thus preventing deterioration of the active layer 210.

The gate insulating layer 220 is formed on the active layer 210 to insulate the active layer 210 from the gate electrode 230. The gate electrode 230 is formed on the gate insulating layer 220. The interlayer insulating layer 240 is formed on the gate electrode 230 to insulate the gate electrode 230 from the source/drain electrodes 250a and 250b.

The source electrode 250a and the drain electrode 250b are spaced apart from each other on the interlayer insulating layer 240 in a facing manner. The source electrode 250a and the drain electrode 250b are connected to one end and the other end of the active layer 210 through a contact hole provided on the interlayer insulating layer 240 and the gate insulating layer 220, respectively.

The passivation layer 260 is provided on the source electrode 250a and the drain electrode 250b and protects the TFT. The planarization layer 270 is formed on the passivation layer 260 to planarize a surface above the first substrate 100.

In this manner, the circuit element layer 200 includes a thin film transistor (TFT) including the gate electrode 230, the active layer 210, the source electrode 250a, and the drain electrode 250b. FIG. 3 illustrates a TFT having a top gate structure in which the gate electrode 230 is formed on an active layer 210 but is not limited thereto. A TFT having a bottom gate structure in which the gate electrode 230 is formed below the active layer 210 may also be formed in the circuit element layer 200.

In a case where the electroluminescence display apparatus according to an example embodiment of the present disclosure is configured as a top emission type, although the TFT is disposed below the light emitting layer 500, light emission is not affected by the TFT, and thus, the TFT may be positioned below the light emitting layer 500.

The first electrode 300 is connected to the drain electrode 250b of the TFT through a contact hole formed in the planarization layer 270 and the passivation layer 260. In some cases, the first electrode 300 may be connected to the source electrode 250a of the TFT through the contact hole formed in the planarization layer 270 and the passivation layer 260.

The bank 400 includes a first bank 410 and a second bank 420. The first bank 410 is formed on the circuit element layer 200 and covers an end of the first electrode 300. The first bank 410 is formed to be thinner than the second bank 420 and has a width larger than that of the second bank 420. The first bank 410 having such a structure has the same hydrophilic properties as the light emitting layer 500. The first bank 410 having the hydrophilic properties may be formed of an inorganic insulating material such as silicon oxide. Therefore, when the light emitting layer 500 is formed by an inkjet process, a solution for forming the light emitting layer 500 may be easily spread on the first bank 410.

The second bank 420 is formed on the first bank 410. The second bank 420 is formed to have a narrower width than the first bank 410. The second bank 420 may be patterned through a photolithography process after applying a solution mixed with a hydrophobic material such as fluorine to an organic insulating material having hydrophilic properties. The hydrophobic material such as fluorine may be moved to an upper portion of the second bank 420 due to light irradiated in the photolithography process, and accordingly, the upper portion of the second bank 420 has hydrophobic properties whereas the other portions have hydrophilic properties. For example, the lower portion of the second bank 420 in contact with the first bank 410 may have hydrophilic properties, and the upper portion of the second bank 420 may have hydrophobic properties. However, the present disclosure is not limited thereto, and the entirety of the second bank 420 may have hydrophobic properties.

Spreadability of the solution for forming the light emitting layer 500 may be improved by the lower portions of the first bank 410 and the second bank 420 having the hydrophilic properties. In particular, because the first bank 410 is formed to have a smaller thickness and a larger width than the second bank 420, a two-step structure having hydrophilic properties is provided by the combination of the first bank 410 and the second bank 420, the solution for forming the light emitting layer 500 may be easily spread to left and right ends of the emission area.

Also, because the solution for forming the light emitting layer 500 is prevented from spreading to the neighboring another emission area by the upper portion of the second bank 420 having the hydrophobic properties, the light emitting layers 500 are prevented from being mixed between the neighboring emission areas.

The light emitting layer 500 is formed on the first electrode 300. The light emitting layer 500 may be formed by an inkjet process. When the light emitting layer 500 is formed by the inkjet process, a height h1 of the upper end of the light emitting layer 500 at the center of the emission area after the solution for the light emitting layer 500 is dried is lower than a height h2 of the upper end of the light emitting layer 500 at the end of the emission area. In particular, as illustrated, a profile in which the height of the light emitting layer 500 gradually lowered from the end of the emission area toward the center of the emission area may be obtained. Accordingly, the portion of the second electrode 600 formed on the light emitting layer 500 is formed to have a profile corresponding to the profile of the light emitting layer 500.

Figure 4:
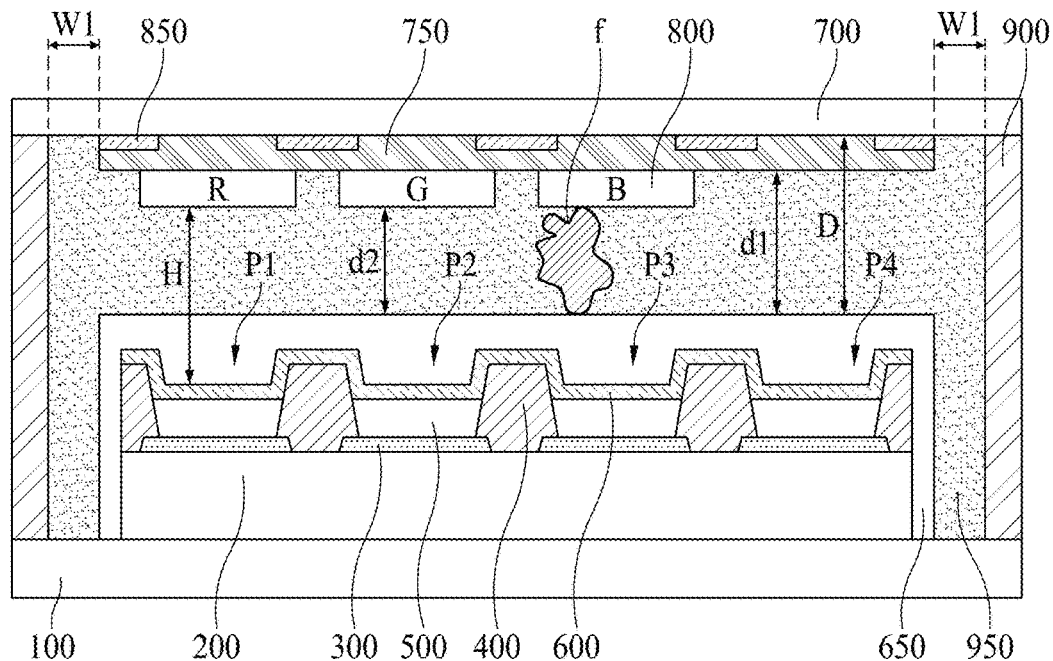
FIGS. 4 to 6 are cross-sectional views of an electroluminescence display apparatus according to various example embodiments of the present disclosure.
Figure 5:
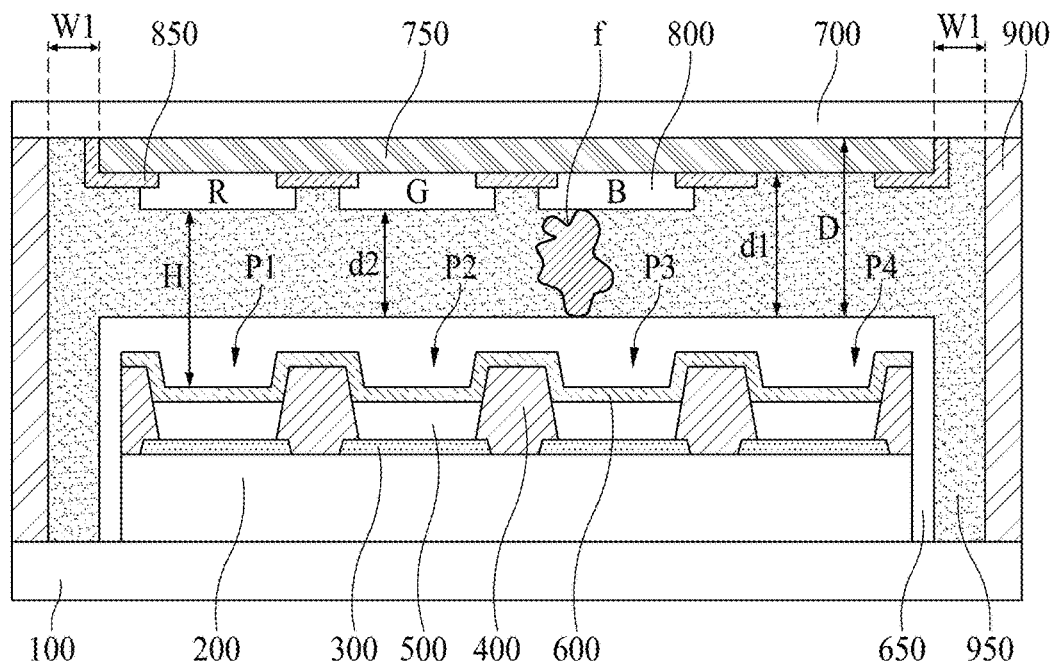
Figure 6:
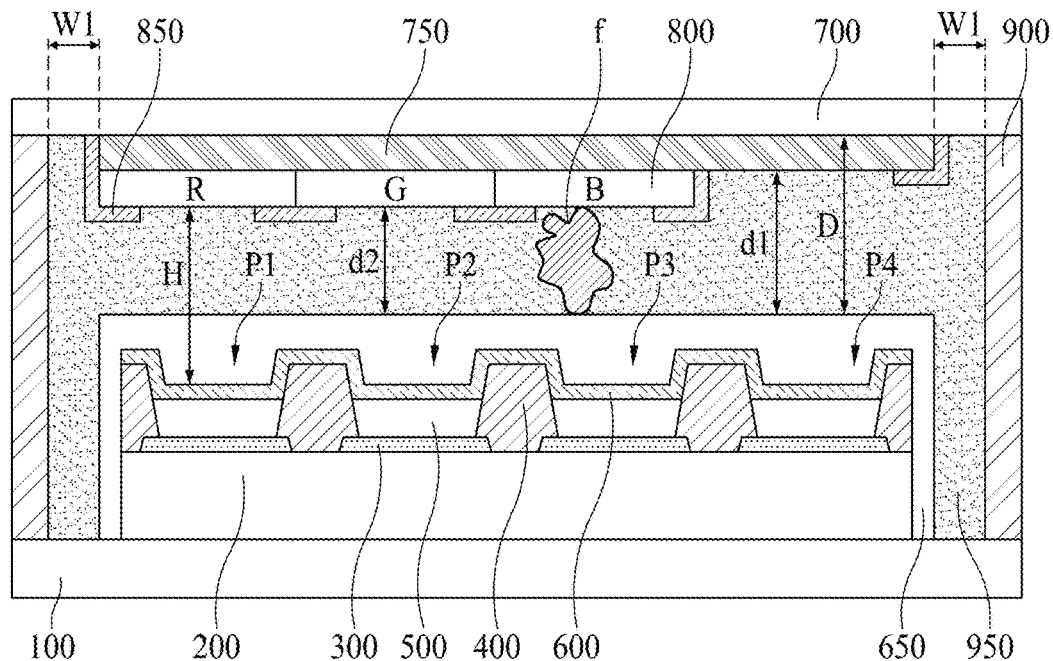

FIGS. 4 to 6 are cross-sectional views of an electroluminescence display apparatus according to various example embodiments of the present disclosure. The electroluminescence display apparatus according to FIGS. 4 to 6 is the same as the electroluminescence display apparatus according to FIG. 2 except that a light blocking layer 850 is additionally provided. Therefore, only different components will be described below.

The light blocking layer 850 is formed in a matrix structure in regions corresponding to the boundaries between the plurality of pixels P1, P2, P3, and P4 to prevent the occurrence of light leakage at the boundaries between the plurality of pixels P1, P2, P3, and P4. The light blocking layer 850 is formed in the regions between the plurality of color filters R, G, and B.

As illustrated in FIG. 4, the light blocking layer 850 may be formed on an inner surface of the second substrate 700. For example, the light blocking layer 850 may be provided between the second substrate 700 and the buffer layer 750. Here, like the buffer layer 750, the light blocking layer 850 might not extend between the dam structure 900 and the second substrate 700 to prevent penetration or permeation of ambient moisture from the boundary of the dam structure 900. Thus, the light blocking layer 850 may be spaced apart from the dam structure 900, rather than being in contact therewith.

As illustrated in FIG. 5, the light blocking layer 850 may be formed on an inner surface of the buffer layer 750. For example, the light blocking layer 850 may be provided between the buffer layer 750 and the color filter layer 800. As described above, the light blocking layer 850 may not extend between the dam structure 900 and the second substrate 700 and may be spaced apart from the dam structure 900, rather than being in contact with the dam structure 900 as described above. Here, the light blocking layer 850 may extend to the inner surface of the second substrate 700 along the edge of the buffer layer 750, and in this case, light leakage at the edge of the second substrate 700 may be reduced.

As illustrated in FIG. 6, the light blocking layer 850 may be formed on an inner surface of the color filter layer 800. As described above, the light blocking layer 850 does not extend between the dam structure 900 and the second substrate 700 and may be spaced apart from the dam structure 900, rather than being in contact with the dam structure 900. Here, the light blocking layer 850 may extend to the inner surface of the second substrate 700 along the edge of the color filter layer 800 and the buffer layer 750, and in this case, the occurrence of light leakage at the edge of the second substrate 700 may be reduced.

Figure 7A:
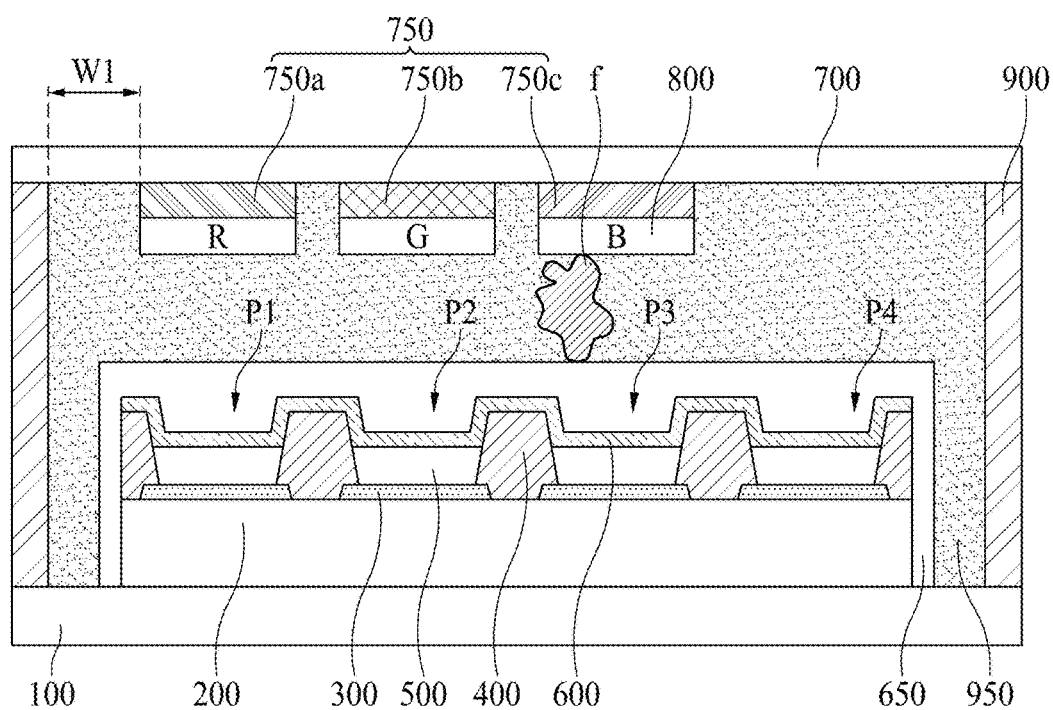
FIG. 7A is a cross-sectional view of an electroluminescence display apparatus according to another example embodiment of the present disclosure.
Figure 7B:
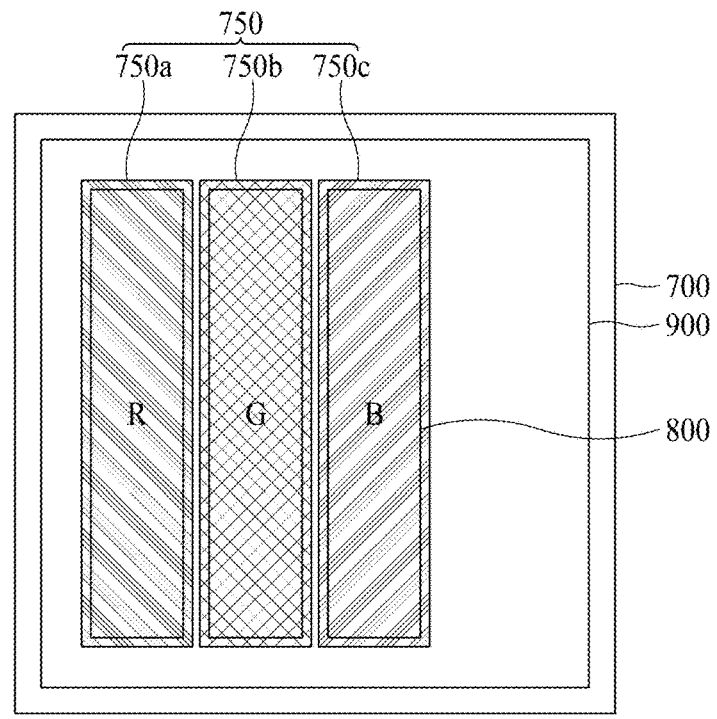
FIG. 7B is a plan view of a second substrate included in an electroluminescence display apparatus according to another example embodiment of the present disclosure.

FIG. 7A is a cross-sectional view of an electroluminescence display apparatus according to another example embodiment of the present disclosure, and FIG. 7B is a plan view of a second substrate included in an electroluminescence display apparatus according to another example embodiment of the present disclosure.

The electroluminescence display apparatus according to FIG. 7A is the same as the electroluminescence display apparatus according to FIG. 2A except that a structure of the buffer layer 750 is changed. Therefore, only different components will be described below.

According to FIG. 2A, the buffer layer 750 is formed in the regions corresponding to the plurality of pixels P1, P2, P3, and P4 regions and in the regions corresponding to the boundary regions between the plurality of pixels P1, P2, P3, and P4. For example, the buffer layer 750 may be formed on the inner surface of the second substrate 700 as a whole.

In contrast, according to FIG. 7A, the buffer layer 750 is formed in regions corresponding to the plurality of pixels P1, P2, P3, and P4 regions, but is not formed in regions corresponding to the boundary regions. Thus, the buffer layer 750 includes a first buffer layer 750a provided in a region corresponding to the first pixel P1 region, a second buffer layer 750b provided in a region corresponding to the second pixel P2 region, and a third buffer layer 750c provided in a region corresponding to the third pixel P3 region.

The first buffer layer 750a may be formed between the second substrate 700 and the red color filter R, the second buffer layer 750b may be formed between the second substrate 700 and the green color filter G, and the third buffer layer 750c may be formed between the second substrate 700 and the blue color filter B. The first buffer layer 750a may have the same pattern as that of the red color filter R, the second buffer layer 750b may have the same pattern as that of the green color filter G, and the third buffer layer 750c may have the same pattern as that of the blue color filter B but is not limited thereto.

With reference to FIG. 7A, because the first buffer layer 750a, the second buffer layer 750b, and the third buffer layer 750c are spaced apart from each other, a portion of the foreign material f may enter a gap formed between the buffer layers 750a, 750b, and 750c, reducing the pressing force due to the foreign material f.

A structure of the second substrate 700 according to FIG. 7B is the same as that of the second substrate 700 according to FIG. 2B except that a structure of the buffer layer 750 is changed. With reference to FIG. 7B, the buffer layer 750 includes a first buffer layer 750a, a second buffer layer 750b, and a third buffer layer 750c spaced apart from each other.

Each of the first buffer layer 750a, the second buffer layer 750b, and the third buffer layer 750c may individually form a row and may be continuous in a column direction, but the present disclosure is not limited thereto. For example, a red color filter R continuous in the same column direction may be formed on the first buffer layer 750a, a green color filter G continuous in the same column direction may be formed on the second buffer layer 750b, and a blue color filter B continuous in the same column direction may be formed on the third buffer layer 750c.

As illustrated, the areas of the first buffer layer 750a, the second buffer layer 750b, and the third buffer layer 750c may be greater than or equal to the areas of the red color filter R, the green color filter G, and the blue color filter B, respectively, or in some cases, the areas of the red color filter R, the green color filter G, and the blue color filter B may be greater than the areas of the first buffer layer 750a, the second buffer layer 750b, and the third buffer layer 750c, respectively.

Figure 8A:
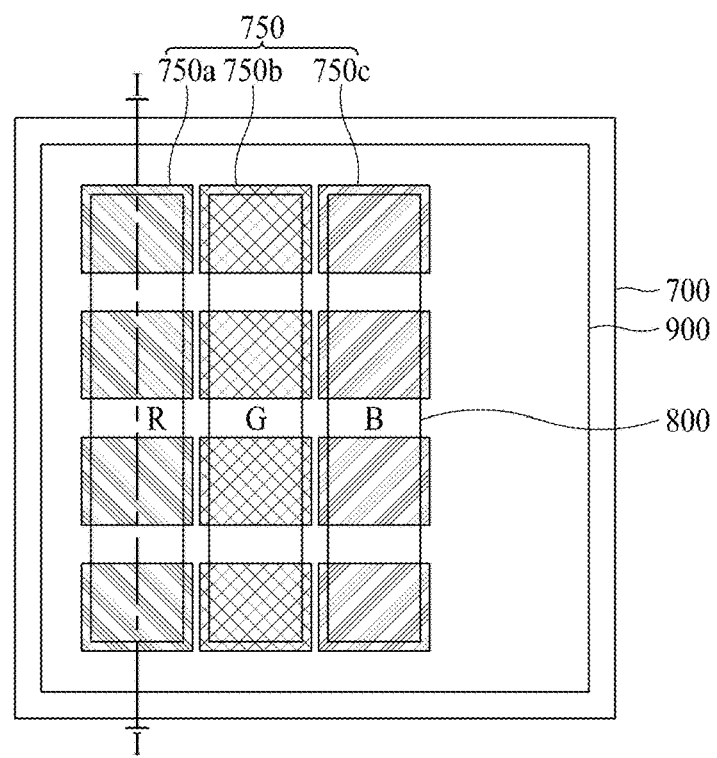
FIG. 8A is a plan view of a second substrate included in an electroluminescence display apparatus according to still another example of the present disclosure.
Figure 8B:
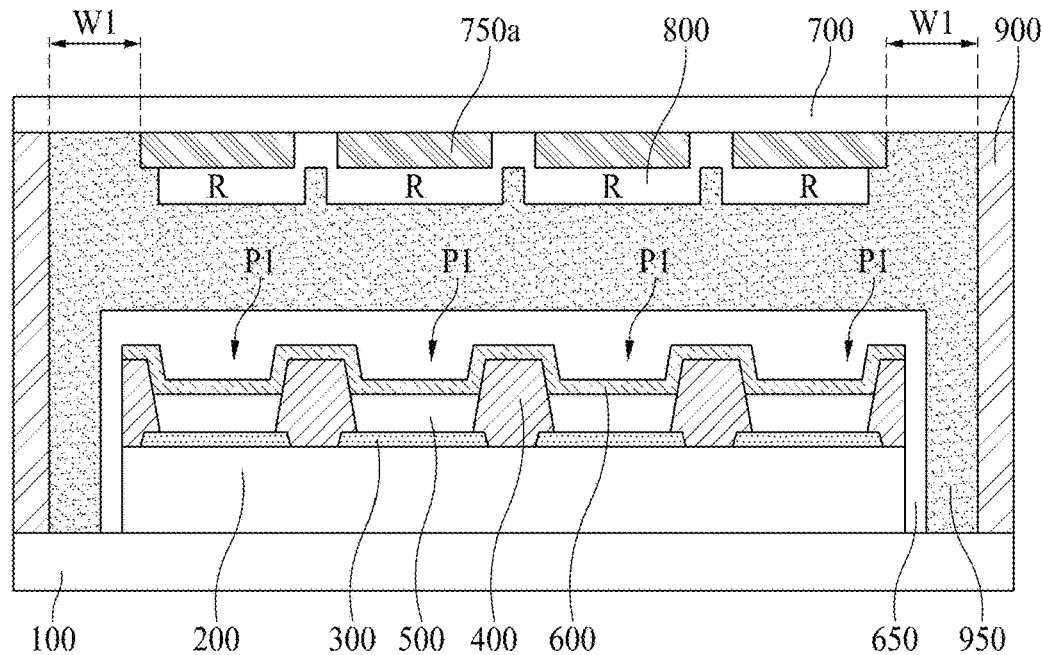
FIG. 8B is a cross-sectional view of an electroluminescence display apparatus taken along line I-I of FIG. 8A.

FIG. 8A is a plan view of a second substrate included in an electroluminescence display apparatus according to still another example embodiment of the present disclosure, and FIG. 8B is a cross-sectional view of an electroluminescence display apparatus taken along line I-I of FIG. 8A.

The structure of the second substrate 700 according to FIG. 8A is the same as that of the second substrate 700 according to FIG. 7B except that the structure of the buffer layer 750 is changed. With reference to FIG. 8A, the first buffer layer 750a, the second buffer layer 750b, and the third buffer layer 750c are spaced apart from each other in the row direction. In addition, the plurality of first buffer layers 750a, the plurality of second buffer layers 750b, and the plurality of third buffer layers 750c are spaced apart in the column direction. For example, the plurality of first buffer layers 750a, the plurality of second buffer layers 750b, and the plurality of third buffer layers 750c may be patterned in each region corresponding to each of the plurality of pixel regions and arranged in a matrix structure as a whole.

Therefore, the red color filter R continuous in the column direction on the first buffer layer 750a may be further formed in the region between the first buffer layers 750a adjacent to each other in the same column, the green color filter G continuous in the column direction on the second buffer layer 750b may be further formed in the region between the second buffer layers 750b adjacent to each other in the same column, and the blue color filter B continuous in the column direction on the third buffer layer 750c is further formed in the region between the third buffer layers 750c adjacent to each other in the same column.

The structure of the color filters R, G, and B may be more easily understood with reference to FIG. 8B. As illustrated in FIG. 8B, the plurality of first buffer layers 750a are spaced apart from each other on an inner surface of the second substrate 700, and a color filter layer 800 including red color filters (not shown) is formed on an inner surface of the plurality of first buffer layers 750a.

Here, the red color filters R are additionally formed in regions between adjacent first buffer layers 750a and are in contact with the inner surface of the second substrate 700 in the regions. Because the red color filter R portions in contact with the inner surface of the second substrate 700 correspond to the boundary regions between the plurality of first pixels P1 emitting the same color, a problem of light leakage and a problem of a degradation of brightness due to a viewing angle do not arise although the red color filter R portions are away from the second electrode 600.

Figure 9:
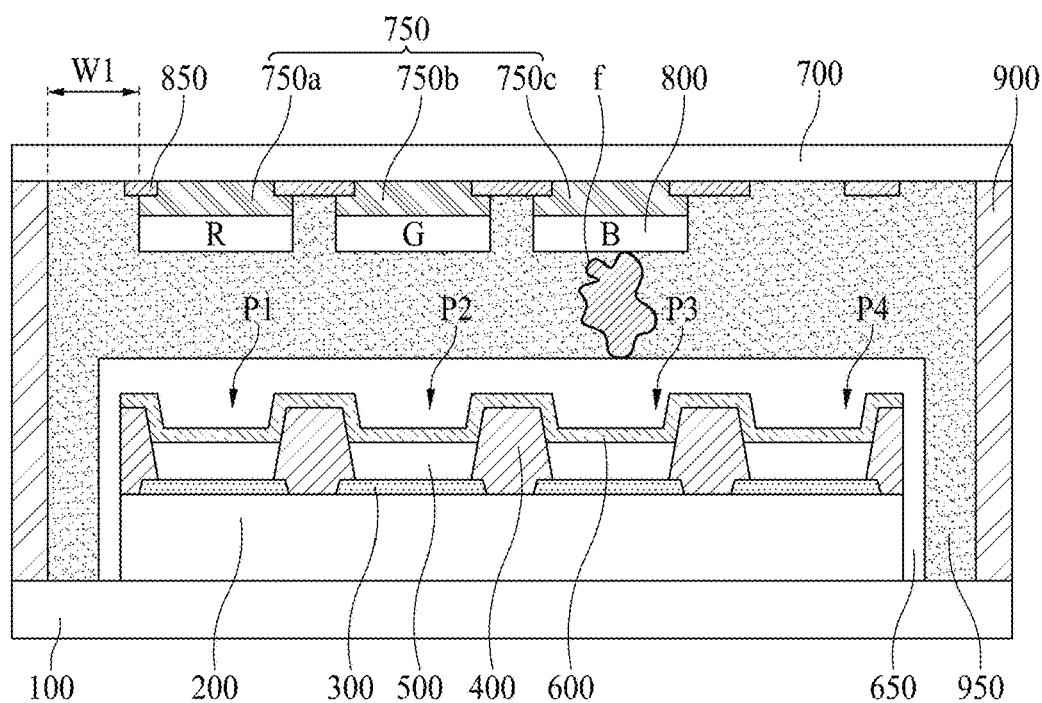
FIGS. 9 to 11 are cross-sectional views of an electroluminescence display apparatus according to various examples of the present disclosure.
Figure 10:
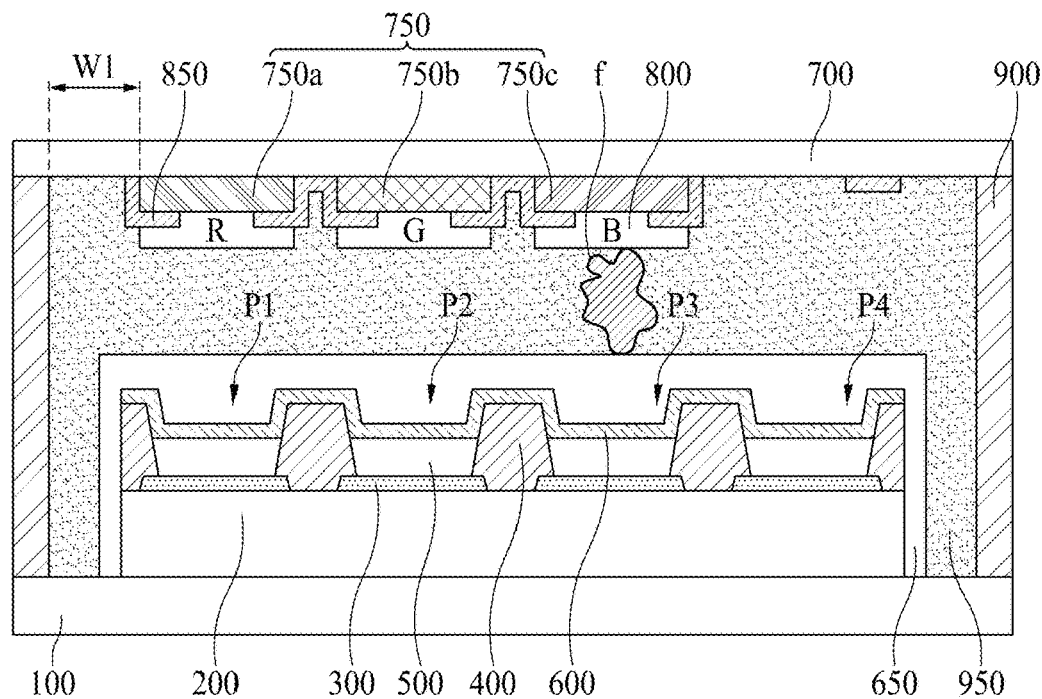
Figure 11:
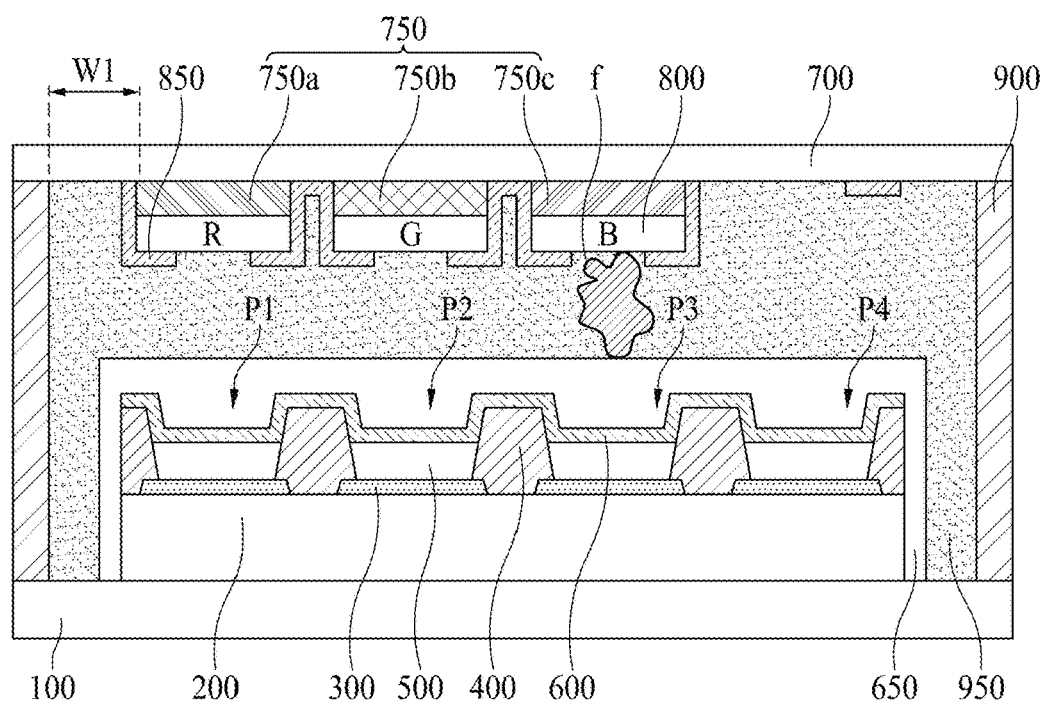

FIGS. 9 to 11 are cross-sectional views of an electroluminescence display apparatus according to various example embodiments of the present disclosure. The electroluminescence display apparatus according to FIGS. 9 to 11 are the same as the electroluminescence display apparatus of FIG. 7A described above, except that a light blocking layer 850 is additionally provided. Thus, the same reference numerals are used for the same components, and only the different components will be described below.

The light blocking layer 850 is formed in a matrix structure in regions corresponding to boundary regions between the plurality of pixels P1, P2, P3, and P4 to prevent or reduce the occurrence of light leakage at the boundaries between the plurality of pixels P1, P2, P3, and P4. For example, the light blocking layer 850 may be formed in the regions between the buffer layers 750a, 750b, and 750c spaced apart from each other, and is formed in the regions between the plurality of color filters R, G, and B.

As illustrated in FIG. 9, the light blocking layer 850 may be provided between the second substrate 700 and the buffer layer 750. Here, the light blocking layer 850 might not extend between the dam structure 900 and the second substrate 700 and may be apart from the dam structure 900 rather than being in contact with the dam structure 900.

As illustrated in FIG. 10, the light blocking layer 850 may be provided between the buffer layer 750 and the color filter layer 800. Here, the light blocking layer 850 does not extend between the dam structure 900 and the second substrate 700 and may be spaced apart from the dam structure 900 rather than being in contact with the dam structure 900. Also, the light blocking layer 850 may extend to an inner surface of the second substrate 700 along the edges of the buffer layers 750a, 750b, and 750c.

As illustrated in FIG. 11, the light blocking layer 850 may be formed on an inner surface of the color filter layer 800. Here, the light blocking layer 850 might not extend between the dam structure 900 and the second substrate 700 and may be spaced apart from the dam structure 900 without being in contact with the dam structure 900. The light blocking layer 850 may extend to an inner surface of the second substrate 700 along the edges of the color filter layer 800 and the buffer layer 750.

When the light blocking layer 850 according to FIGS. 9 to 11 is applied to the electroluminescence display apparatus according to FIG. 8A, the light blocking layer 850 is formed in a matrix structure in regions between a plurality of buffer layers 750a, 750b, and 750c patterned in regions corresponding to the pixel regions.

Figure 12:
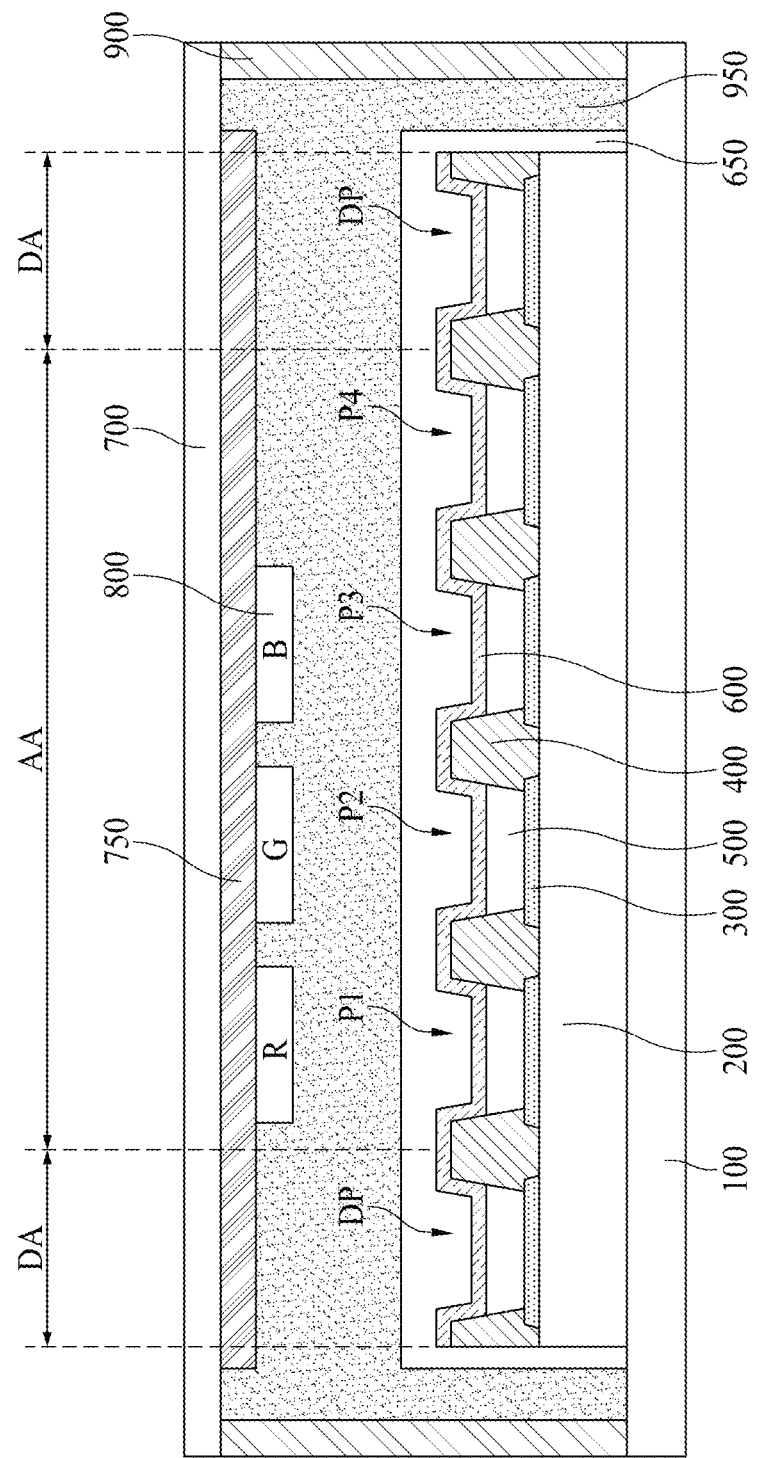
FIG. 12 is a cross-sectional view of an electroluminescence display apparatus according to yet another example embodiment of the present disclosure.

FIG. 12 is a cross-sectional view of an electroluminescence display apparatus according to yet another example embodiment of the present disclosure.

As illustrated in FIG. 12, the electroluminescence display apparatus according to yet another embodiment of the present disclosure includes an active area AA and a dummy area DA. The active area AA serves as a display area for displaying an image. A plurality of pixels P1, P2, P3, and P4 are provided in the active area AA.

The dummy area DA is provided outside the active area AA. The dummy area DA includes a plurality of dummy pixels DP. Because the dummy area DA is not a display area for displaying an image, the dummy pixel DP provided in the dummy area DA has a structure different from that of the pixels P1, P2, P3, and P4 provided in the active area AA. For example, the dummy pixels DP provided in the dummy area DA may not include at least one of the signal line, the thin film transistor, and a light emitting device or may incompletely include them, whereby light emission does not occur in the dummy pixel DP. When light emission occurs in the dummy area DA, display quality of the electroluminescence display apparatus may be degraded due to leakage light that occurs in the dummy area DA.

The electroluminescence display apparatus according to yet another embodiment of the present disclosure includes the first substrate 100, the circuit element layer 200, the first electrode 300, the bank 400, the light emitting layer 500, the second electrode 600, the encapsulation layer 650, the second substrate 700, the buffer layer 750, the color filter layer 800, the dam structure 900, and the filling layer 950.

The circuit element layer 200 is formed in both the active area AA and the dummy area DA. The circuit element layer 200 may be formed and have the same structure through the same process in the active area AA and the dummy area DA. However, the present disclosure is not limited thereto and the circuit element layer 200 formed in the dummy area DA may not include some of signal lines such as the gate line, the data line, the power line, and the reference line or may not have some of the switching TFT and the driving TFT so that light emission may not occur in the dummy area DA. In some cases, the circuit element layer 200 formed in the dummy area DA may be incompletely configured so that either the switching TFT or the driving TFT does not operate.

The first electrode 300 is formed in both the active area AA and the dummy area DA. The first electrode 300 may be formed and have the same structure through the same process in the active area AA and the dummy area DA. However, the first electrode 300 may not be formed in the dummy area DA, and thus, light emission may not occur in the dummy area DA.

The bank 400 is formed in both the active area AA and the dummy area DA. The bank 400 may be formed and have the same structure through the same process in the active area AA and the dummy area DA.

The light emitting layer 500 is formed in both the active area AA and the dummy area DA. The light emitting layer 500 may be formed through the same process and have the same structure in the active area AA and the dummy area DA. However, unlike the light emitting layer 500 formed in the active area AA, the light emitting layer 500 formed in the dummy area DA may not have some organic layers, and thus, light emission may not occur in the dummy area DA.

The second electrode 600 is formed in both the active area AA and the dummy area DA. The second electrode 600 may be formed through the same process and have the same structure in the active area AA and the dummy area DA. However, the second electrode 600 may not be formed in the dummy area DA, and thus, light emission may not occur in the dummy area DA.

The encapsulation layer 650 is formed in both the active area AA and the dummy area DA. For example, the encapsulation layer 650 may extend from the active area AA to the dummy area DA.

The buffer layer 750 is formed in both the active area AA and the dummy area DA. For example, the buffer layer 750 may extend from the active area AA to the dummy area DA. However, the present disclosure is not limited thereto, and the buffer layer 750 may be formed only in the active area AA and not in the dummy area DA. This is because, although an element is defective due to pressing of the foreign material f in the dummy area DA, it does not affect image quality.

However, the buffer layer 750 may be formed in both the active area AA and the dummy area DA to maintain a uniform cell gap. In a case where cracking or the like occurs due to pressing of the foreign material f in the dummy area DA, the cracking may be transferred to the active area AA, and thus, the buffer layer 750 may be formed also in the dummy area DA.

The structure of the buffer layer 750 may be changed to the various embodiments described above.

The color filter layer 800 is formed in the active area AA but not in the dummy area DA. In this case, a height of a space in which the foreign material f is accommodated in the dummy area DA may be increased, reducing a defective element due to the pressing of the foreign material f. However, the present disclosure is not limited thereto, and the color filter layer 800 may be formed also in the dummy area DA.

The dam structure 900 is provided at an outer portion of the dummy area DA. The filling layer 950 is formed in both the active area AA and the dummy area DA.

Although not shown, the light blocking layer 850 having the various structures described above may be additionally formed on the second substrate 700.

According to an example embodiment of the present disclosure, because the buffer layer is formed on the inner surface of the second substrate, the distance between the encapsulation layer and the second substrate may be increased, thereby reducing damage to an element due to a foreign material.

According to another example embodiment of the present disclosure, because the buffer layer is formed between the second substrate and the color filter layer, the distance between the encapsulation layer and the second substrate is increased, without increasing the distance between the color filter layer and the first substrate, whereby light leakage and a degradation of brightness due to a viewing angle may be prevented and damage to an element due to the foreign material may be reduced.

It will be apparent to those skilled in the art that various modifications and variations can be made in the electroluminescence display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescence display apparatus, comprising:
   a first substrate;
   a second substrate facing the first substrate;
   a light emitting layer on the first substrate between the first and second substrates;
   an encapsulation layer on the light emitting layer;
   a buffer layer on an inner surface of the second substrate facing the first substrate;
   a color filter layer including a first color filter and a second color filter on the buffer layer; and
   a dam structure bonding the first substrate and the second substrate at edges of the first substrate and the second substrate,
   wherein an elastic modulus of the buffer layer is smaller than an elastic modulus of the encapsulation layer such that the buffer layer absorbs pressing so that the encapsulation layer and the light emitting layer are not pressed, and
   wherein the buffer layer is spaced apart from the dam structure.

2. The electroluminescence display apparatus of claim 1, further comprising a filling layer between the encapsulation layer and the color filter layer with the filling layer in contact with the buffer layer.

3. The electroluminescence display apparatus of claim 1, further comprising a light blocking layer on the inner surface of the second substrate between the first color filter and the second color filter with the light blocking layer being spaced apart from the dam structure.

4. The electroluminescence display apparatus of claim 3, wherein the light blocking layer extends along an edge of the buffer layer and is in contact with the inner surface of the second substrate.

5. The electroluminescence display apparatus of claim 1, wherein the buffer layer includes a first buffer layer and a second buffer layer spaced apart from each other.

6. The electroluminescence display apparatus of claim 5, wherein the first buffer layer is between the second substrate and the first color filter, and the second buffer layer is between the second substrate and the second color filter.

7. The electroluminescence display apparatus of claim 1, wherein the buffer layer includes a plurality of first buffer layers spaced apart from each other in a first direction, and
   wherein the first color filter is in contact with the second substrate between the plurality of first buffer layers adjacent to each other.

8. The electroluminescence display apparatus of claim 1, further comprising a bank having a matrix structure such that openings of the matrix structure define emission areas and the light emitting layer is disposed in the emission areas,
   wherein a lower portion of the bank has hydrophilic properties, and an upper portion of the bank has hydrophobic properties, and
   wherein, in a respective one of the emission areas, the light emitting layer has a thickness at a center that is less than a thickness adjacent to the bank.

9. An electroluminescence display apparatus, comprising:
   a first substrate, a second substrate facing the first substrate;
   a light emitting layer on the first substrate between the first and second substrates;
   an encapsulation layer on the light emitting layer;

a buffer layer on an inner surface of the second substrate facing the first substrate; and a dam structure bonding the first substrate and the second substrate at edges of the first substrate and the second substrate, wherein an elastic modulus of the buffer layer is smaller than an elastic modulus of the encapsulation layer such that the buffer layer absorbs pressing so that the encapsulation layer and the light emitting layer are not pressed, and wherein the buffer layer is spaced apart from the dam structure.

10. The electroluminescence display apparatus of claim 9, further comprising a color filter layer on the buffer layer such that the buffer layer is disposed between the second substrate and the color filter layer.

11. The electroluminescence display apparatus of claim 10, wherein the color filter layer includes a first color filter and a second filter, wherein the buffer layer includes a first buffer layer between the first substrate and the first color filter, and a second buffer layer between the second substrate and the second color filter, and wherein the first buffer layer and the second buffer layer are spaced apart from each other.

12. The electroluminescence display apparatus of claim 9, further comprising a bank having a matrix structure such that openings of the matrix structure define emission areas and the light emitting layer is disposed in the emission areas, wherein a lower portion of the bank has hydrophilic properties, and an upper portion of the bank has hydrophobic properties, and wherein, in a respective one of the emission areas, the light emitting layer has a thickness at a center that is less than a thickness adjacent to the bank.

13. An electroluminescence display apparatus defining an active area and a dummy area, comprising:

a first substrate;

a second substrate facing the first substrate;

a light emitting layer on the first substrate in the active area and the dummy area;

an encapsulation layer on the light emitting layer in the active area and the dummy area;

a buffer layer on an inner surface of the second substrate facing the first substrate in the active area and the dummy area; and a dam structure bonding the first substrate and the second substrate at edges of the first substrate and the second substrate, wherein an elastic modulus of the buffer layer is smaller than an elastic modulus of the encapsulation layer such that the buffer layer absorbs pressing so that the encapsulation layer and the light emitting layer are not pressed, and wherein the buffer layer is spaced apart from the dam structure.

14. The electroluminescence display apparatus of claim 13, further comprising a color filter layer on the buffer layer in the active area.

15. The electroluminescence display apparatus of claim 14, wherein the color filter layer includes a first color filter and a second filter, wherein the buffer layer includes a first buffer layer between the first substrate and the first color filter, and a second buffer layer between the second substrate and the second color filter, and wherein the first buffer layer and the second buffer layer are spaced apart from each other.

16. The electroluminescence display apparatus of claim 13, further comprising a bank having a matrix structure such that openings of the matrix structure define emission areas and the light emitting layer is disposed in the emission areas, wherein a lower portion of the bank has hydrophilic properties, and an upper portion of the bank has hydrophobic properties, and wherein, in a respective one of the emission areas, the light emitting layer has a thickness at a center that is less than a thickness adjacent to the bank.

* * * * *